US00RE44368E

(19) United States
(12) Reissued Patent
Hatanaka et al.

(10) Patent Number: US RE44,368 E
(45) Date of Reissued Patent: Jul. 16, 2013

(54) TEMPERATURE-COMPENSATED CRYSTAL OSCILLATOR

(75) Inventors: Hidefumi Hatanaka, Kagoshima (JP); Ryoma Sasagawa, Kagoshima (JP)

(73) Assignee: Kyocera Corporation, Kyoto (JP)

(21) Appl. No.: 12/500,454

(22) Filed: Jul. 9, 2009

Related U.S. Patent Documents

Reissue of:

(64) Patent No.: 7,242,258
Issued: Jul. 10, 2007
Appl. No.: 11/474,565
Filed: Jun. 26, 2006

U.S. Applications:

(63) Continuation of application No. 10/857,442, filed on May 28, 2004, now abandoned.

(30) Foreign Application Priority Data

May 29, 2003 (JP) ..... 2003-152390
Jun. 26, 2003 (JP) ..... 2003-183455

(51) Int. Cl.
*H03B 1/00* (2006.01)

(52) U.S. Cl.
USPC ..... 331/68; 331/66; 331/158; 331/108 D; 331/176; 257/698; 257/690; 438/106; 438/107

(58) Field of Classification Search
USPC ..... 331/66, 158, 108 D, 68; 257/690, 257/698; 438/106, 107
See application file for complete search history.

(56) References Cited

U.S. PATENT DOCUMENTS 6,229,404 B1 5/2001 Hatanaka
6,445,254 B1 9/2002 Shibuya et al.

(Continued)

FOREIGN PATENT DOCUMENTS

JP 11121477 A 4/1999
JP 2000077942 A 3/2000

(Continued)

OTHER PUBLICATIONS

Japanese language office action dated Jan. 25, 2008 and its English language translation for corresponding Japanese application 2004160101.

(Continued)

*Primary Examiner* — Arnold Kinkead
(74) *Attorney, Agent, or Firm* — DLA Piper LLP (US)

(57) ABSTRACT

An inventive temperature-compensated crystal oscillator has a construction such that a crystal oscillator element (5) is accommodated in a container (1) and an IC element (7) for controlling an oscillation output on the basis of the oscillation of the crystal oscillator element (5) is mounted on a lower surface of the container (1). A plurality of electrode pads (10) at least including plural crystal electrode pads connected to the crystal oscillator element (5), plural writing control electrode pads, and an oscillation output electrode pad, a ground electrode pad, a power source voltage electrode pad and an oscillation control electrode pad connected to surface mounting external terminals are arranged in a matrix configuration of m rows×n columns (wherein m and n are natural numbers not smaller than 2) in an IC element mounting area. The IC element (7) is electrically connected to the electrode pads (10). The temperature-compensated crystal oscillator is excellent in IC element bonding reliability, and meets the need for the size reduction of the entire structure.

34 Claims, 15 Drawing Sheets

U.S. PATENT DOCUMENTS

| | | | |
|---|---|---|---|
| 6,667,664 | B2 | 12/2003 | Akagawa et al. |
| 6,762,537 | B1 | 7/2004 | Kikushima |
| 6,778,029 | B2 | 8/2004 | Mizusawa |
| 2002/0135429 | A1 | 9/2002 | Akagawa et al. |
| 2003/0197569 | A1 | 10/2003 | Mizusawa |

FOREIGN PATENT DOCUMENTS

| | | | |
|---|---|---|---|
| JP | 2000-278047 | | 10/2000 |
| JP | 2000278047 | A | 10/2000 |
| JP | 2000299611 | A | 10/2000 |
| JP | 2000349191 | A | 12/2000 |
| JP | 2001-291742 | | 10/2001 |
| JP | 2001291742 | A | 10/2001 |
| JP | 2002-198740 | | 7/2002 |
| JP | 2002198453 | A | 7/2002 |
| JP | 2002198740 | A | 7/2002 |
| JP | 2002329839 | A | 11/2002 |
| JP | 2003124745 | A | 4/2003 |
| WO | 0033455 | A1 | 6/2000 |

OTHER PUBLICATIONS

Japanese language office action dated Jul. 10, 2008 and its English language translation for corresponding Japanese application 2004160101.

Japanese language office action dated Dec. 9, 2008 and its English language translation for corresponding Japanese application 2004160101.

PRIOR ART

PRIOR ART

TEMPERATURE-COMPENSATED CRYSTAL OSCILLATOR

Matter enclosed in heavy brackets [ ] appears in the original patent but forms no part of this reissue specification; matter printed in italics indicates the additions made by reissue.

CROSS-REFERENCE TO THE RELATED APPLICATIONS

This is a continuation of application Ser. No. 10/857,442 filed May 28, 2004, now abandoned the entire contents of which are incorporated by reference. This application also claims benefit of priority under 35 U.S.C. § 119 to Japanese Patent Application No. 2003-152390 filed May 29, 2003 and Japanese Patent Application No. 2003-183455 filed Jun. 26, 2003, the entire contents of which are incorporated by reference.

BACKGROUND OF THE INVENTION

1. Field of the Invention

The present invention relates to a temperature-compensated crystal oscillator for use in an electronic device such as a mobile communication device.

2. Description of the Related Art

Conventionally, temperature-compensated crystal oscillators are employed in electronic devices such as mobile communication devices.

A conventionally known temperature-compensated crystal oscillator has a construction such that a container 23 is bonded onto an upper surface of a planar substrate 21 having a plurality of external terminals 22 provided on a lower surface thereof as shown in FIGS. 21(a) and 21(b). A crystal oscillator element 24 is accommodated in the container 23. An IC element 26 which controls an oscillation output on the basis of the oscillation of the crystal oscillator element 24 is provided in a cavity 25 defined by a lower surface of the container 23 and an interior surface of a frame base 27 attached to the lower surface of the container 23.

The container 23 is adapted to hermetically seal the crystal oscillator element 24 accommodated therein without communication with the atmosphere. The container 23 includes a base plate composed of an electrically insulative material and a seal ring 31 attached to an upper surface of the base plate. The crystal oscillator element 24 is attached to the upper surface of the base plate in the seal ring 31. A metal lid 32 is welded to an upper surface of the seal ring 31 by seam welding(resistance welding), whereby the space in which the crystal oscillator element 24 is accommodated is hermetically sealed.

In general, the base plate of the container 23 and the frame base 21 are integrally formed of a ceramic material such as glass-ceramic. Interconnection conductors are provided in and on the base plate and the frame base. A conventionally known ceramic green sheet laminating method is employed for the formation of the base plate and the frame base.

An IC element 26 mounting area on the planar substrate 21 is illustrated as having a rectangular shape by a solid line in FIG. 22. As shown, a plurality of electrode pads 28 respectively connected to electrodes of the IC element 26 are arranged in two rows as stated, for example, in Japanese Unexamined Patent Publication No. 2001-291742. Five electrode pads are arranged in one of the two rows, and six electrode pads are arranged in the other row.

A flip chip IC element 26 having a plurality of connection pads is employed as the IC element 26. Where the flip chip IC element 26 is mounted on a lower side of a mounting base 23, the connection pads of the IC element 26 are first brought into contact with the corresponding electrode pads 28 in the IC element 26 mounting area with the intervention of electrically conductive bonding members such as of a solder, and then the electrically conductive bonding members of the solder are heat-melted at a high temperature for the mounting of the IC element 26 on the mounting base 23.

However, the plan area of the aforesaid temperature-compensated crystal oscillator is reduced to 7 mm×5 mm, to 5 mm×3 mm, and further to 3 mm×2 mm. With the size reduction of the oscillator, there is an increasing demand for the size reduction of the IC element 26. As a result, the pitch of the electrode pads 28 should be reduced with the need for the reduction of the IC element 26 mounting area. This reduces the bonding reliability, leading to limited flexibility in routing interconnection conductors 29 connected to the electrode pads 28.

In order to flatten the oscillation output by oscillation control by means of the IC element 26 according to the specific temperature characteristic of the crystal oscillator element 24 of the temperature-compensated crystal oscillator, the specific temperature characteristic of the crystal oscillator element 24 should preliminarily be measured before the mounting of the IC element 26. However, the size reduction of the electrode pads makes it difficult to measure the specific temperature characteristic, drastically reducing the productivity.

An advantage of the present invention is to provide a temperature-compensated crystal oscillator which totally has a reduced size and yet maintains and improves the bonding reliability of an IC element.

BRIEF SUMMARY OF THE INVENTION

A temperature-compensated crystal oscillator comprises: a container accommodating therein a crystal oscillator element; a mounting base bonded to a lower surface of the container and having surface mounting external terminals provided on a lower surface (mounting surface) thereof; and an IC element mounted on the mounting base for controlling an oscillation output on the basis of temperature compensation data for compensating for a temperature characteristic of the crystal oscillator element; wherein a plurality of electrode pads including plural crystal electrode pads connected to the crystal oscillator element, an oscillation output electrode pad, a ground electrode pad, a power source voltage electrode pad, and plural writing control electrode pads connected to the surface mounting external terminals are arranged in a matrix configuration of in rows×n columns (wherein m and n are natural numbers not smaller than 2) in an IC element mounting area on the mounting base; wherein the IC element has a plurality of connection pads provided on a main surface thereof and electrically connected to the corresponding electrode pads. The term "surface mounting" herein means that a surface of an electronic component such as a crystal oscillator is attached directly to a mother board with the use of a solder.

At least one of the electrode pads arranged in the IC element mounting area on the mounting base is a dummy electrode pad bonded to a corresponding one of the connection pads of the IC element.

The electrode pads are arranged at a predetermined pitch linearly in the rows and in the columns, and the respective rows extend perpendicularly to the respective columns.

The mounting base comprises at least two laminated insulative layers and an interconnection conductor provided between the two insulative layers and connected to a via-hole conductor disposed just below or above the electrode pads.

The natural numbers m and n are not smaller than 3, and the electrode pad connected to the interconnection conductor via the via-hole conductor is surrounded by the other electrode pads.

The IC element comprises a semiconductor device and a re-interconnection layer provided on a main surface of the semiconductor device for associating the connection pads of the IC element with electrode pad positions.

The mounting base has a planar shape, and a spacer having a thickness greater than a height of the IC element is provided on the lower surface of the container.

The mounting base has a cavity formed in an upper surface thereof and accommodating therein the IC element, and an upper surface portion of the mounting base around an opening of the cavity is bonded to the lower surface of the container.

Alternatively, the mounting base has a cavity accommodating therein the IC element, and is bonded to the lower surface of the container with a surface portion thereof around an opening of the cavity facing downward.

A temperature-compensated crystal oscillator comprises: a mounting base having a cavity which opens to an upper surface of the mounting base; a crystal oscillator element provided in the cavity; and an IC element provided in the cavity for controlling a predetermined oscillation output on the basis of temperature compensation data for compensating for a temperature characteristic of the crystal oscillator element; wherein the mounting base has a lower surface serving as a mounting surface; wherein a plurality of electrode pads including a pair of crystal electrode pads connected to the crystal oscillator element, an oscillation output electrode pad, a ground electrode pad, a power source voltage electrode pad and a writing electrode pad for writing the temperature compensation data are arranged in a matrix configuration of m rows×n columns (wherein m and n are natural numbers not smaller than 2) in an IC element mounting area on a bottom surface of the cavity; wherein the IC element has a plurality of connection pads provided on a lower surface thereof and electrically connected to the corresponding electrode pads.

At least one of the electrode pads arranged in the IC element mounting area on the bottom surface of the cavity is a dummy electrode pad bonded to a corresponding one of the connection pads of the IC element.

The electrode pads are arranged at a predetermined pitch linearly in the rows and in the columns, and the respective rows extend perpendicularly to the respective columns.

The mounting base comprises at least two laminated insulative layers and an interconnection conductor provided between the two insulative layers and connected to a via-hole conductor disposed just below or above a predetermined one of the electrode pads.

The natural numbers m and n are not smaller than 3, and the electrode pad connected to the interconnection conductor via the via-hole conductor is surrounded by the other electrode pads.

The IC element comprises a semiconductor device and a re-interconnection layer provided on a main surface of the semiconductor device for associating the connection pads of the IC element with electrode pad positions.

In the temperature-compensated crystal oscillator, at least the plural crystal electrode pads (e.g., two crystal electrode pads) connected to the crystal oscillator element, the at least two writing control electrode pads, and the oscillation output electrode pad, the ground electrode pad, the power source voltage electrode pad and an oscillation control electrode pad respectively connected to the surface mounting external terminals are provided below the lower surface of the container. That is, at least eight electrode pads are provided. In addition, these electrode pads are arranged in the matrix configuration of m rows×n columns (wherein m and n are natural numbers not smaller than 2). The connection pads of the IC element are electrically connected to the corresponding electrode pads. Therefore, the electrode pads are evenly arranged in a not smaller than 3×3 matrix configuration (e.g., in a 3×4 matrix configuration).

Thus, the electrode pads are provided in the generally entire IC element mounting area. Even if the size of the IC element is reduced, the occupation ratio of the electrode pads in the IC element mounting area can be increased, and a dead space in the container and a dead space in the IC element mounting area can be eliminated. This significantly contributes to the size reduction of the entire temperature-compensated crystal oscillator.

Where the IC element is bonded to the electrode pads via electrically conductive bonding members, junctures of the electrode pads are distributed over the generally entire lower surface of the IC element. Therefore, the IC element can stably be bonded to the electrode pads.

The IC element adapted for the electrode pads is constructed such that the laminate interconnection substrate (re-interconnection layer) is integrally provided on the mounting surface of the semiconductor device and protected by a resin such as an epoxy resin. The connection pads are provided on the mounting surface of the laminate interconnection substrate in association with the electrode pads. The IC element having such a construction can very easily be mounted on the aforesaid electrode pads and electrically connected to the electrode pads.

At least one of the electrode pads arranged in the m×n matrix configuration (wherein m and n are natural numbers not smaller than 2) in the IC element mounting area in the container is the dummy electrode pad connected to the corresponding connection pad of the IC element. Where the minimum necessary number of the electrode pads is eight as described above, for example, the electrode pads can be arranged in a 3×3 square matrix configuration by providing one dummy electrode pad. Thus, the bonding strength of the IC element is improved by providing the dummy electrode pad in association with a connection pad of the IC element having no function without the need for providing an underfill resin which is conventionally widely used for the improvement of the bonding strength of the IC element.

The electrode pads are arranged at the predetermined pitch linearly in the rows and in the columns, and the respective rows extend perpendicularly to the respective columns. Thus, the junctions of the IC element are evenly located, so that the bonding reliability of the IC element is improved. Further, the re-interconnection layer of the IC element can very easily be designed.

The mounting base has a structure such that the at least two insulative layers are laminated and the interconnection conductor connected to the via-hole conductor disposed just below or above the predetermined electrode pad is provided between the two insulative layers. That is, there is no need for routing an interconnection conductor from the electrode pad on the surface of the mounting base, making it possible to prevent a short circuit which may otherwise occur due to a foreign matter adhering on the exposed interconnection conductor. Further, an electrically conductive bonding member can be prevented from flowing out of an electrode pad region. Thus, the IC element can be bonded to the mounting base with a higher reliability.

The natural numbers m and n are not smaller than 3, and the electrode pad connected to the interconnection conductor via the via-hole conductor is surrounded by the other electrode pads. Thus, there is no need for routing the interconnection conductor from the electrode pad located at an inner position of the matrix configuration on the surface of the mounting base, making it possible to prevent a short circuit between the electrode pads. The electrode pad surrounded by the other electrode pads herein includes three or four adjacent electrode pads arranged in a row or in a column.

The mounting base has a planar shape, and the spacer having a thickness greater than the height of the IC element is provided on the lower surface of the container.

The cavity accommodating therein the IC element is provided in the upper surface of the mounting base, and the upper surface portion of the mounting base around the opening of the cavity is bonded to the lower surface of the container.

Alternatively, the mounting base has the cavity accommodating therein the IC element, and is bonded to the lower surface of the container with the surface portion thereof around the opening of the cavity facing downward.

In the temperature-compensated crystal oscillator, the cavity opens to the upper surface of the mounting base, and the crystal oscillator element and the IC element for controlling the predetermined oscillation output on the basis of the temperature compensation data for compensating for the temperature characteristic of the crystal oscillator element are accommodated in the cavity. The lower surface of the mounting base serves as the mounting surface. At least eight electrode pads are provided in the IC element mounting area on the bottom surface of the cavity. The electrode pads are arranged in the matrix configuration of m rows×n columns (wherein m and n are natural numbers not smaller than 2). The connection pads of the IC element are electrically connected to the corresponding electrode pads. The electrode pads are arranged in a not smaller than 3×3 matrix configuration (e.g., in a 3×4 matrix configuration).

Thus, the electrode pads are provided in the generally entire IC element mounting area. Even if the size of the IC element is reduced, the occupation ratio of the electrode pads in the IC element mounting area can be increased, and a dead space in the container and a dead space in the IC element mounting area can be eliminated. This significantly contributes to the size reduction of the temperature-compensated crystal oscillator.

Where the IC element is bonded to the electrode pads via electrically conductive bonding members, the junctures are distributed over the generally entire lower surface of the IC element. Therefore, the IC element can stably be bonded to the electrode pads.

The IC element adapted for the electrode pads is constructed such that the laminate interconnection substrate (re-interconnection layer) is provided on the mounting surface of the semiconductor device and protected by a resin such as an epoxy resin. The connection pads are provided on the mounting surface of the laminate interconnection substrate in association with the electrode pads. The IC element having such a construction can very easily be mounted on the aforesaid electrode pads and electrically connected to the electrode pads.

The electrode pads arranged in the m×n matrix configuration (wherein m and n are natural numbers not smaller than 2) in the IC element mounting area on the bottom surface of the cavity of the mounting base include the dummy electrode pad connected to the IC element. Where the minimum necessary number of the electrode pads is eight as described above, for example, the electrode pads can be arrange in a 3×3 square matrix configuration by providing one dummy electrode pad. Thus, the bonding strength of the IC element is improved by providing the dummy electrode in association with a connection pad of the IC element having no function without the need for providing an under-fill resin which is conventionally widely used for the improvement of the bonding strength of the IC element. Further, the crystal oscillator element is prevented from being adversely influenced by out-gassing from the under-fill resin.

The electrode pads are arranged at a predetermined pitch linearly in the rows and in the columns, and the respective rows extend perpendicularly to the respective columns. Thus, the junctures of the IC element are evenly located, so that the bonding reliability of the IC element is improved. Further, the re-interconnection layer of the IC element can very easily be designed.

The mounting base has a structure such that the at least two insulative layers are laminated and the interconnection conductor connected to the via-hole conductor disposed just below or above the predetermined electrode pad is provided between the two insulative layers. That is, there is no need for routing an interconnection conductor from the electrode pad on the surface of the mounting base, making it possible to prevent a short circuit which may otherwise occur due to a foreign matter adhering on the exposed interconnection conductor. Further, an electrically conductive bonding member can be prevented from flowing out of the electrode pad region. Thus, the IC element can be bonded with a higher reliability.

The natural numbers m and n are not smaller than 3, and the electrode pad connected to the interconnection conductor via the via-hole conductor is surrounded by the other electrode pads. Thus, there is no need for routing the interconnection conductor from the electrode pad located at an inner position in the matrix configuration on the surface of the mounting base, making it possible to prevent a short circuit between the electrode pads. The electrode pad surrounded by the other electrode pads herein includes three or four adjacent electrode pads arranged in a row or in a column.

According to the present invention, even if the size of the IC element is reduced for the size reduction of the temperature-compensated crystal oscillator, the bonding reliability of the IC element can be maintained and improved. This significantly contributes to the size reduction of the entire temperature-compensated crystal oscillator.

DETAILED DESCRIPTION OF THE INVENTION

The inventive temperature-compensated crystal oscillators will hereinafter be described in detail with reference to the attached drawings.

Figure 1:
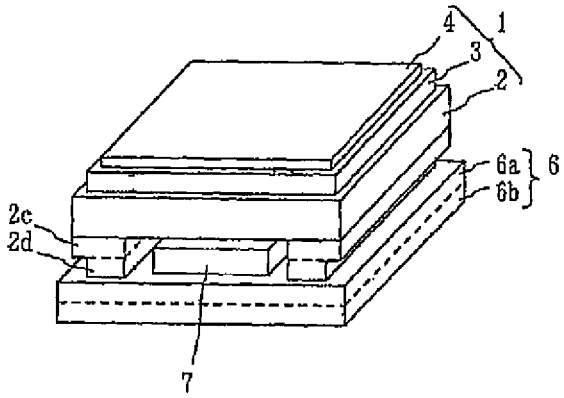
FIG. 1 is a perspective view of a temperature-compensated crystal oscillator according to one embodiment of the present invention.
Figure 2:
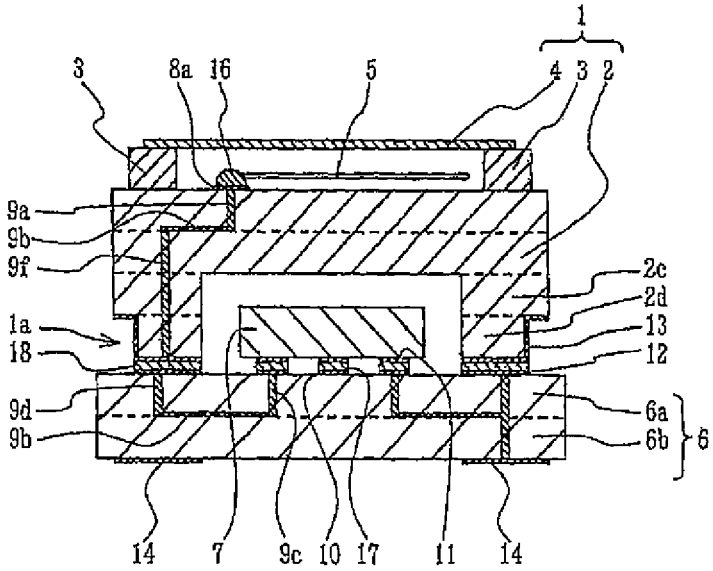
FIG. 2 is a sectional view of the temperature-compensated crystal oscillator of FIG. 1.

FIG. 1 is a perspective view of a temperature-compensated crystal oscillator according to one embodiment of the present invention, and FIG. 2 is a sectional view of the temperature-compensated crystal oscillator of FIG. 1.

The temperature-compensated crystal oscillator shown in these figures has a construction such that a planar mounting base 6 provided with an IC element 7 is bonded to a lower surface of a container 1 in which a crystal oscillator element 5 is accommodated.

The container 1 includes a laminate substrate 2 composed of a ceramic material such as glass-ceramic or alumina ceramic, a seal ring 3 composed of a metal such as a 42-alloy, cobal or phosphor bronze, and a lid 4 composed of the same metal as the seal ring 3. The seal ring 3 is attached to an upper surface of the laminate substrate 2, and the lid 4 is placed and fixed onto an upper surface of the seal ring 3. The crystal oscillator element 5 is mounted on the upper surface of the laminate substrate 2 inside the seal ring 3.

The container 1 has a space defined by the upper surface of the laminate substrate 2, an interior surface of the seal ring 3 and a lower surface of the lid 4, and the crystal oscillator element 5 is accommodated in this space and hermetically sealed. A pair of mounting pads 8a, 8b (a mounting pad 8b is not shown in FIG. 2) connected to oscillation electrodes of the crystal oscillator element 5 are provided on the upper surface of the laminate substrate 2.

As shown in FIG. 2, the laminate substrate 2 has legs 2c, 2d provided on a lower surface thereof. The legs 2c, 2d are composed of the same material as the laminate substrate 2. A plurality of container connection electrodes 13 are provided on lower surfaces of the legs 2c, 2d.

The laminate substrate 2 including the legs 2c, 2d has first via-hole conductors 9a, fifth via-hole conductors 9f and interconnection conductors 9b provided therein.

Where the laminate substrate 2 of the container 1 is composed of a ceramic material such as glass-ceramic, the laminate substrate 2 is produced, for example, by applying an electrically conductive paste in a predetermined pattern by printing to form the mounting pads 8a, 8b and the interconnection conductors 9b on surfaces of a ceramic green sheet prepared by mixing an organic solvent or the like with ceramic material powder, forming conductors as the first via-hole conductors 9a and the fifth via-hole conductors 9f in ceramic green sheets, stacking and pressing these ceramic green sheets, and sintering the resulting laminate at a high temperature.

The seal ring 3 and the lid 4 of the container 1 are produced by forming a metal such as a 42-alloy into predetermined configurations by a conventionally known metal processing method. The container 1 is assembled by brazing the seal ring 3 to an electrically conductive layer preliminarily formed on the upper surface of the laminate substrate 2, mounting and fixing the crystal oscillator element 5 to the upper surface of the laminate substrate 2 with the use of electrically conductive bonding members 16, performing an initial frequency adjustment of the crystal oscillator element 5, and bonding the aforesaid lid 4 to the upper surface of the seal ring 3 in a predetermined atmosphere by a conventionally known resistance welding method or the like. Where the seal ring 3 and the lid 4 are thus bonded by the resistance wielding, the seal ring 3 and the lid 4 are each preliminarily coated with an Ni layer, an Au layer or the like by plating.

The crystal oscillator element 5 accommodated in the container 1 is produced by forming the pair of oscillation electrodes on opposite main surfaces of a crystal piece cut along a predetermined crystal axis, and is capable of oscillating at a predetermined frequency. The crystal oscillator element 5 is mounted on the upper surface of the laminate substrate 2 with the pair of oscillation electrodes thereof electrically connected to the mounting pads 8a, 8b (collectively denoted by a reference numeral 8) on the upper surface of the laminate substrate 2 via the electrically conductive bonding members 16. Thus, the electrical connection and the mechanical connection between the crystal oscillator element 5 and the container 1 are simultaneously achieved.

Where the metal lid 4 of the container 1 is connected to an external ground terminal 14 (to be described later) via the electrodes and the interconnection conductors provided in and on the laminate substrate 2 of the container 1 and the mounting base 6, the container 1 has a shielding function with the lid 4 being grounded in use. Thus, the crystal oscillator element 5 and the IC element 7 (to be described later) can be protected from unwanted external electromagnetic noises.

The mounting base 6 includes laminated substrates 6a, 6b of a ceramic material such as glass-ceramic or alumina ceramic, and has first via-hole conductors 9a, fifth via-hole conductors 9f and interconnection conductors 9b, as well as fourth via-hole conductors 9e, second via-hole conductors 9c, third via-hole conductors 9d and interconnection conductors 9b provided therein.

Where the mounting base 6 is composed of a ceramic material such as glass-ceramic, the mounting base 6 is produced, for example, by applying an electrically conductive paste in a predetermined pattern by printing to form the interconnection conductors 9b on a surface of a ceramic green sheet prepared by mixing a proper organic solvent or the like with ceramic material powder, forming conductors as the fourth via-hole conductors 9e, the second via-hole conductors 9c and the third via-hole conductors 9d in ceramic green sheets, stacking and pressing these ceramic green sheets, and sintering the resulting laminate at a high temperature.

A plurality of electrode pads 10 connected to connection pads 11 of the IC element 7 provided between the legs 2c, 2d of the container 1 are provided on a center portion of an upper surface of the mounting base 6. That is, the legs 2c, 2d function as spacers to provide a space between a bottom surface of a recess of the container 1 and the upper surface of the mounting base 6 for mounting the IC element 7.

Figure 3:
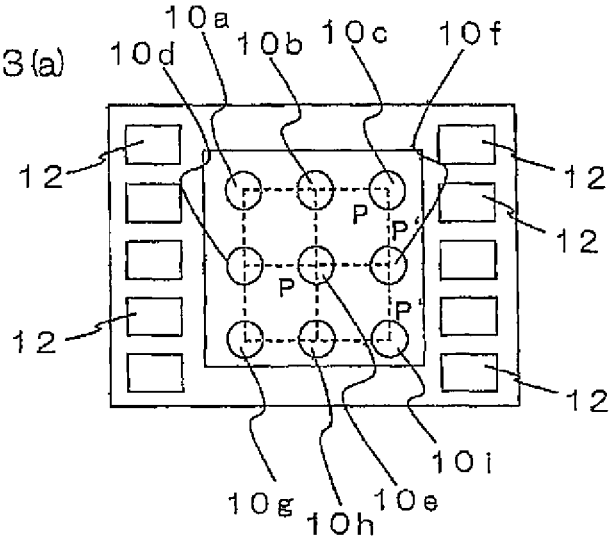
FIG. 3(a) is a plan view of a mounting base of the temperature-compensated crystal oscillator of FIG. 1 as seen from an upper side thereof.
FIGS. 3(b) and 3(c) are plan views illustrating other conceivable arrangements of electrode pads provided in an IC element mounting area of the mounting base.
Figure 3:
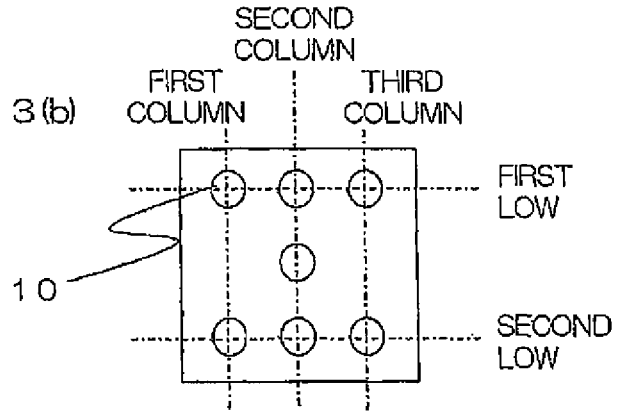
Figure 3:
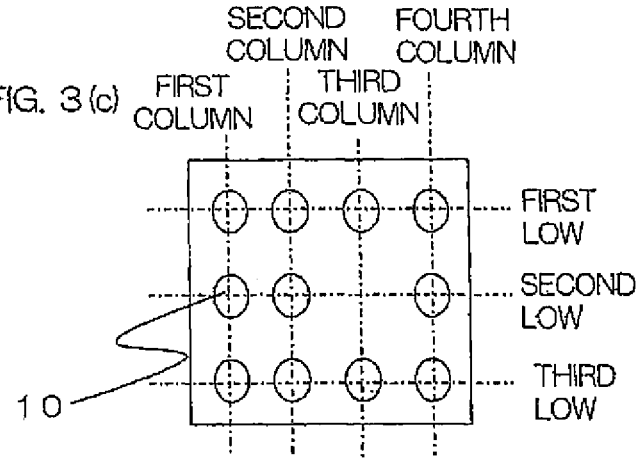

As shown in FIG. 3(a), two crystal electrode pads 10d, 10f, an oscillation output electrode pad 10a, a ground electrode pad 10h, a power source voltage electrode pad 10c, an oscillation control electrode pad 10i and at least two or more writing control electrode pads 10b, 10e, 10g (which are collectively denoted by a reference numeral 10) respectively connected to the connection pads 11 of the IC element 7 via electrically conductive bonding members 17 such as of a solder are arranged, for example, in a matrix configuration of 3 rows×3 columns in an IC element mounting area where the IC element 7 is mounted on the upper surface of the mounting base 6. Where the connection pads 11 of the IC element 7 are respectively connected to the electrode pads 10 via solder bumps, the connection pads 11 are preferably configured so as to cover the corresponding electrode pads 10, i.e., so as to have slightly greater sizes than the corresponding electrode pads 10. Thus, solder balls respectively formed on the connection pads 11 do not drop out of the connection pads 11. Even if the IC element is slightly offset, a short circuit between the adjacent electrically conductive bonding members 17 can be prevented.

Although the electrode pads 10 generally arranged longitudinally and transversely in a matrix configuration of m rows×n columns (wherein m and n are natural numbers not smaller than 2) are herein arranged in a square matrix configuration as shown in FIG. 3(a), the electrode pads 10 may be arranged as shown in FIG. 3(b) or FIG. 3(c). Where two or more electrode pads 10 are linearly arranged, the linear arrangement of the electrode pads 10 is regarded as a row or a column. Where the electrode pads 10 are arranged in the IC element mounting area as shown in FIG. 3(b), for example, the electrode pads 10 are regarded to be arranged in a 3×2 matrix configuration. Where the electrode pads 10 are arranged as shown in FIG. 3(c), the electrodes 10 are regarded to be arranged in a 3×4 matrix configuration.

Where eight electrode pads are required for an operation of the temperature-compensated crystal oscillator as described above, one dummy electrode pad is provided for arranging the electrode pads in a 3×3 matrix configuration. Where the total number of the electrode pads is increased due to provision of an increased number of writing control electrode pads 10, dummy electrode pads are additionally provided for arranging the electrode pads in a 3×4 matrix configuration, in a 4×4 matrix configuration or in a 4×5 matrix configuration.

Figure 4:
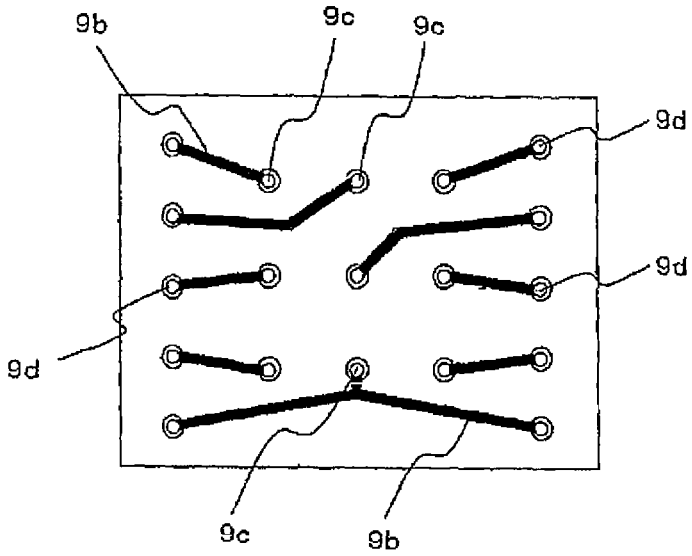
FIG. 4 is a plan view illustrating interconnection conductors and via-hole conductors provided in a laminate substrate of the mounting base.

As shown in FIG. 4, the interconnection conductors 9b, the fourth via-hole conductors 9e connected to the interconnection conductors 9b and extending downward in the mounting base 6, and the second via-hole conductors 9c and the third via-hole conductors 9d extending upward from the interconnection conductors 9b are provided in the mounting base 6. The formation of the interconnection conductors 9b and the first to third via-hole conductors 9a, 9c, 9d is achieved by a common mounting base production method.

On the other hand, the interconnection conductors 9b, the first via-hole conductors 9a connected to the interconnection conductors 9b and extending upward in the laminate substrate 2 and the fifth via-hole conductors 9f extending downward from the interconnection conductors 9b are provided in the laminate substrate 2. The formation of the interconnection conductors 9b and the forth and fifth via-hole conductors 9e, 9f is achieved by a common laminate substrate production method.

The fourth via-hole conductors 9e respectively connect external terminals 14 to predetermined ones of the interconnection conductors 9b.

The fifth via-hole conductors 9f respectively connect the container connection electrodes 13 on the lower surface of the laminate substrate 2 to predetermined ones of the interconnection conductors 9b.

Here, the first via-hole conductors 9a respectively connect the mounting pads connected to the crystal oscillator element 5 located on the upper surface of the laminate substrate 2 to predetermined ones of the interconnection conductors 9b. Similarly, an interconnection conductor 9 kept at a ground potential is connected to the seal ring 3.

The second via-hole conductors 9c respectively connect the electrode pads 10 provided on the mounting base 6 to predetermined ones of the interconnection conductors 9b.

Further, the third via-hole conductors 9d respectively connect mounting base connection electrodes 12 provided on the upper surface of the mounting base 6 to predetermined ones of the interconnection conductors 9b.

Figure 7:
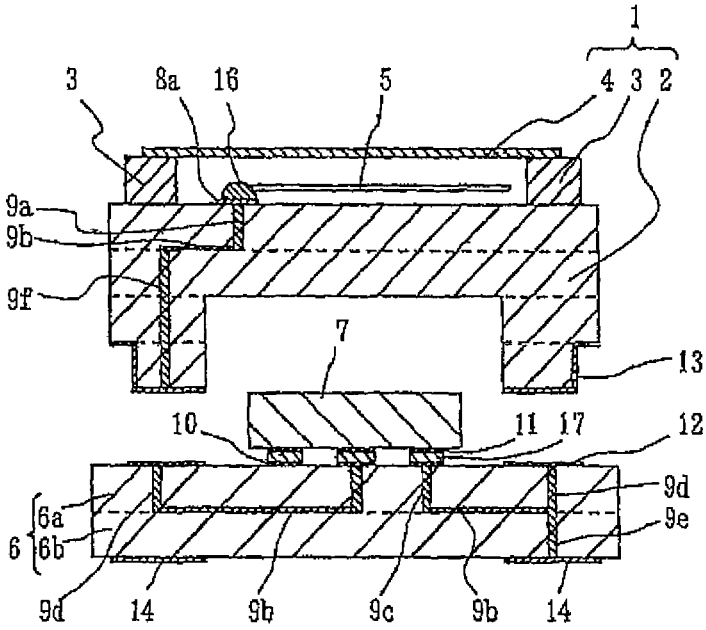
FIG. 7 is an exploded sectional view of a temperature-compensated crystal oscillator according to another embodiment of the present invention, particularly illustrating connection of a crystal electrode pad.

Therefore, the crystal electrode pads 10d and 10f are respectively connected to the mounting pads 8 of the crystal oscillator element 5 via the second via-hole conductor 9c, the interconnection conductor 9b, the third via-hole conductor 9d, the mounting base connection electrode 12, the container connection electrode 13, the fifth via-hole conductor 9f, the interconnection conductor 9b and the first via-hole conductor 9a, and to the mounting base connection electrode 12 via the second via-hole conductor 9c, the interconnection conductor 9b and the third via-hole conductor 9d, for example, as shown in an exploded diagram of FIG. 7.

Figure 8:
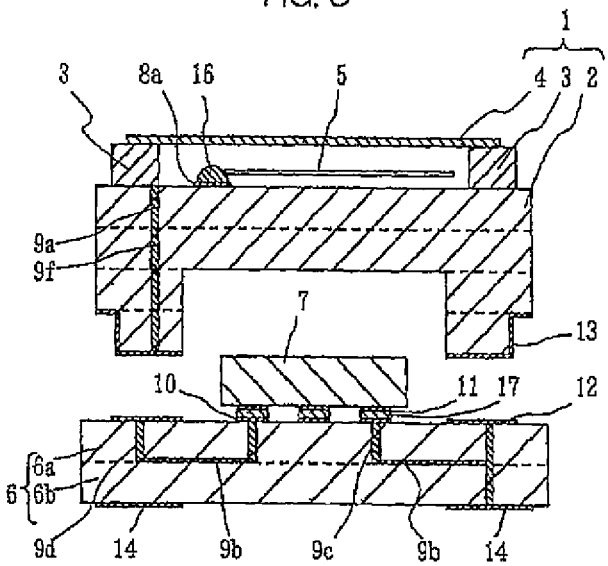
FIG. 8 is an exploded sectional view of a temperature-compensated crystal oscillator according to another embodiment of the present invention, particularly illustrating connection of an electrode pad to an external terminal.

The oscillation output electrode pad 10a is connected to the mounting base connection electrode 12 via the second via-hole conductor 9c, the interconnection conductor 9b and the third via-hole conductor 9d as shown on a right-hand side of an exploded diagram of FIG. 8.

The ground electrode pad 10h is connected to the mounting base connection electrodes 12 via the second via-hole conductor 9c, the interconnection conductor 9b and the third via-hole conductor 9d as shown on a left-hand side of an exploded diagram of FIG. 8. The mounting base connection electrode 12 is connected to the seal ring 3 via the container connection electrode 13, the fifth via-hole conductor 9f and the first via-hole conductor 9a.

Like the oscillation output electrode pad 10a, the power source voltage electrode pad 10c and the oscillation control electrode pad 10i are respectively connected to the mounting base connection electrodes 12 via the second via-hole conductors 9c, the interconnection conductors 9b and the third via-hole conductors 9d.

The writing control electrode pads 10b, 10e, 10g are respectively connected to the mounting base connection electrodes 12 via the second via-hole conductors 9c, the interconnection conductors 9b and the third via-hole conductors 9d.

Figure 5:
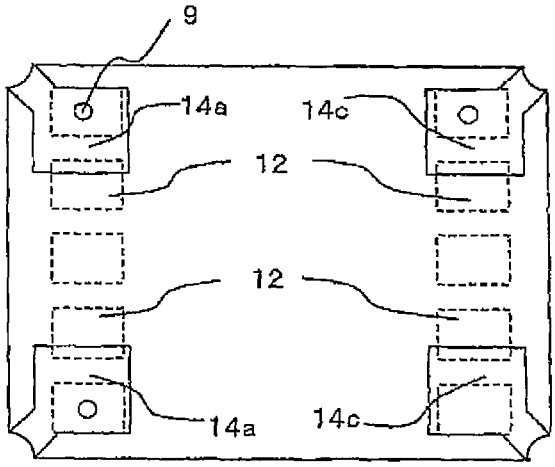
FIG. 5 is a plan view illustrating the mounting base of the temperature-compensated crystal oscillator of FIG. 1 as seen through from a lower side thereof.

As shown in a bottom view of FIG, 5, the plurality of mounting base connection electrodes 12 (indicated by broken lines in FIG. 5) electrically and/or mechanically connected to the corresponding container connection electrodes 13 on the lower surface of the container 1 are disposed on the upper surface of the mounting base 6. Four external terminals 14a to 14d (an oscillation output terminal 14a, a ground terminal 14b, a power source voltage terminal 14c and an oscillation control terminal 14d) are respectively provided in four corners on the lower surface of the mounting base 6. The external terminals 14 are electrically connected to the corresponding connection electrodes 12 via electrically conductive films or the like provided at the corners of the mounting base 6. Where the external terminals 14 overlap thicknesswise with the corresponding connection electrodes 12, the external terminals 14 may be connected to the corresponding connection electrodes 12 via via-hole conductors 9.

Here, the container connection electrodes 13 on the lower surface of the container 1 are provided in one-to-one correspondence with the mounting base connection electrodes 12 on the upper surface of the mounting base 6, and firmly connected to the mounting base connection electrodes 12 via electrically conductive bonding members 18. In this embodiment, five mounting base connection electrodes 12 are provided on each side on the upper surface of the mounting base 6. Out of the ten mounting base connection electrodes 12 in total, only the mounting base connection electrodes 12 connected to the crystal electrode pads 10d, 10f and the writing control electrode pads 10b, 10e, 10g are extracted through corresponding ones of the ten container connection electrodes 13 on the container 1. The mounting base connection electrodes 12 connected to the ground electrode pad 10h, the power source voltage electrode pad 10c, the oscillation control electrode pad 10i and the oscillation output electrode pad 10a are not extracted through the container connection electrodes 13. The ground electrode pad 10h, the power source voltage electrode pad 10c, the oscillation control electrode pad 10i and the oscillation output electrode 10a are electrically connected to the corresponding external terminals 14 via none of the mounting base connection electrodes 12, but via the second via-hole conductors 9c, the interconnection conductors 9b and the fourth via-hole conductors 9e.

The container connection electrodes 13 connected to the crystal electrode pads (the crystal oscillator element 5) are used as measurement pads for measuring the oscillation characteristic of the crystal oscillator element 5 in a hermetically sealed state. The crystal electrode pads 10d, 10f may be formed as having a greater size, and employed as the measurement pads for the measurement of the oscillation characteristic before the mounting of the IC element 7.

Figure 9:
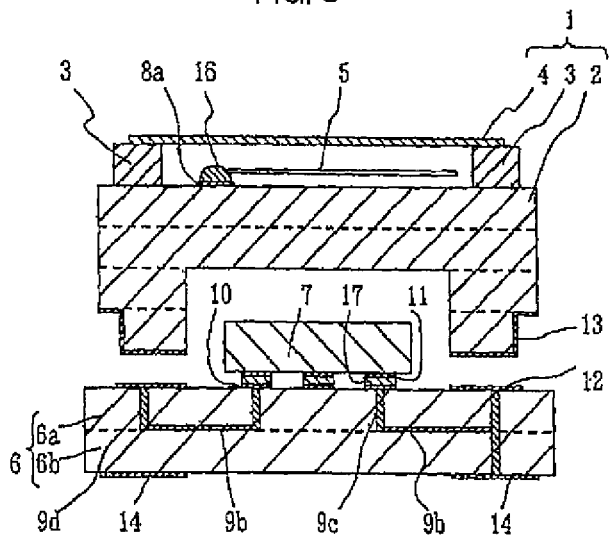
FIG. 9 is an exploded sectional view of a temperature-compensated crystal oscillator according to another embodiment of the present invention, particularly illustrating extraction of a writing control electrode pad.

The container connection electrodes 13 respectively connected to the writing control electrode pads are connected to writing terminals provided on a lateral side of the oscillator for writing temperature compensation data to a temperature compensation circuit. For example, the container connection electrodes 13 are partly exposed in recesses 1a defined in the vicinity of junctures between the legs 2c, 2d of the container 1 and the mounting base 6 as shown in FIG. 9. Thus, the temperature compensation data according to the temperature characteristic of the crystal oscillator element 5 can be written in a memory provided in the temperature compensation circuit of the IC element 7 by bringing a probe needle of a data writing device into contact with the writing terminals. Connection paths from the container connection electrodes 13 or the mounting base connection electrodes 12 to the writing control electrode pads are each established through the third via-hole conductor 9d, the interconnection conductor 9b and the second via-hole conductor 9c. Alternatively, the writing terminals may be provided on an outward margin provided integrally with the legs 2c, 2d of the container 1 and, after completion of the writing of the temperature compensation data, the margin may be separated from the legs 2c, 2d of the container 1.

The temperature-compensated crystal oscillator is electrically connected to a predetermined circuit interconnection of a mother board via the aforesaid four external terminals 14. Where the ground external terminal 14b and the oscillation output external terminal 14a out of the external terminals 14 are located apart from the power source voltage external terminal 14c and the oscillation control external terminal 14d, noise interference with the oscillation output can effectively be prevented.

Figure 6A:
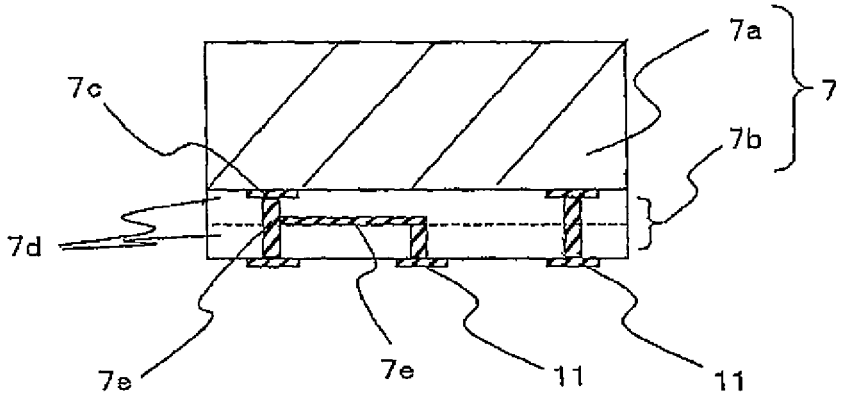
FIGS. 6(a) and 6(b) are a sectional view of an IC element of the temperature-compensated crystal oscillator of FIG. 1 and a plan view of the IC element as seen from the lower side thereof, respectively.
Figure 6B:
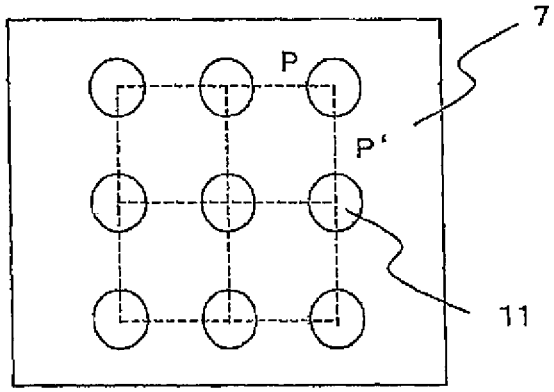

The IC element 7 connected to the electrode pads 10 of the mounting base 6 is a rectangular flip-chip IC including a semiconductor device 7a and a re-interconnection layer 7b provided on a main surface of the semiconductor device 7a for associating the connection pads of the IC element 7 with electrode pad positions as shown in FIGS. 6(a) and 6(b). The semiconductor device 7a is provided with a temperature detection element which detects an ambient temperature, a storage element in which the temperature compensation data for compensating for the temperature characteristic of the crystal oscillator element 5 is written, a temperature compensation circuit which corrects the oscillation characteristic of the crystal oscillator element 5 on the basis of predetermined temperature compensation data for the ambient temperature, an oscillation circuit connected to the temperature compensation circuit for generating a predetermined oscillation output, and the like.

The semiconductor device 7a has internal connection electrodes 7c provided on amounting surface thereof. The internal connection electrodes 7c are irregularly arranged, because the internal connection electrodes 7c are disposed away from the elements integrated in the semiconductor device 7a and circuit formation regions.

The re-interconnection layer 7b provided on the mounting surface of the semiconductor device 7a has a plurality of insulative layers 7d, predetermined interconnection layers 7e (including via-hole conductors extending thicknesswise of the insulative layers), and the connection pads 11. Therefore, the connection pads 11 are arranged in a matrix configuration on the mounting surface of the re-interconnection layer 7b so that the internal connection electrodes 7c irregularly arranged are rearranged in association with the electrode pads 10. In addition, the connection pads 11 are evenly distributed on the mounting surface. When the connection pads 11 are respectively bonded to the electrode pads 10, the bonding strength can be improved with junctures between the connection pads and the electrode pads being evenly distributed.

For the improvement of the bonding strength between the IC element 7 and the electrode pads 10, the connection pads 11 may include a dummy connection pad connected to none of the internal connection electrodes 7c.

The connection pads 11 provided on the lower surface of the IC element 7 are electrically connected to the corresponding electrode pads 10 provided on the upper surface of the mounting base 6 via the electrically conductive bonding members 17 such as solder bumps or gold bumps, whereby the IC element 7 is bonded to the upper surface of the mounting base 6. Thus, the predetermined elements and the circuits in the IC element 7 are electrically connected to the crystal oscillator element 5 and the external terminals 14 on the lower surface of the mounting base 6 via the second via-hole conductors 9c, the interconnection conductors 9b and the like.

In the inventive temperature-compensated crystal oscillate; the crystal electrode pads 10d, 10f, the at least two writing control electrode pads 10b, 10e, 10g, and the oscillation output electrode pad 10a, the ground electrode pad 10h, the power source voltage electrode pad 10c and the oscillation control electrode pad 10i respectively connected to the external terminals 14a, 14b, 14c, 14d are longitudinally and transversely arranged in the matrix configuration. The connection pads 11 of the IC element 7 are provided in association with the respective electrode pads 10 and electrically connected to the electrode pads 10. Thus, the electrode pads 10 are evenly arranged in the matrix configuration on the entire IC element mounting area.

Even if the size of the IC element 7 is reduced, the electrode pads 10 can effectively be provided in the IC element mounting area at a higher occupation ratio. That is, a dead space in the IC element mounting area on the mounting base 6 can be minimized. This contributes to the size reduction of the temperature-compensated crystal oscillator.

Further, when the IC element 7 is bonded to the electrode pads 10 via the electrically conductive bonding members 17, the junctures are evenly distributed in the IC element mounting area, allowing for stable bonding of the IC element 7.

The IC element 7 is constructed such that the re-interconnection layer 7b is provided on the main surface of the semiconductor device 7a for associating the connection pads of the IC element 7 with the electrode pad positions. Therefore, the electrical connection between the connection pads 11 and the electrode pads 10 can assuredly and easily be achieved.

Further, the electrode pads 10 may include a dummy electrode pad connected to the IC element 7. Where the minimum necessary number of the electrode pads is eight, for example, the electrode pads can be arranged in a 3×3 square matrix configuration by providing one dummy electrode pad. The dummy electrode pad is associated with a connection pad 11 of the IC element 7 having no function, whereby the bonding strength of the IC element 7 can be improved. Hence, there is no need for providing an under-fill resin which is conventionally widely used for the improvement of the bonding strength of the IC element.

As indicated by broken lines in FIG. 3(a), the electrode pads 10 are arranged linearly at a predetermined pitch in the rows and in the columns, and the respective rows are arranged perpendicularly to the respective columns. Thus, the junctures on the IC element 7 can evenly be arranged. Therefore, the bonding reliability of the IC element 7 is improved, and the re-interconnection layer 7b of the IC element 7 can very easily be designed.

Since the second via-hole conductors 9c in the mounting base 6 are connected directly to the corresponding electrode pads 10, the total length of interconnection conductors routed from the electrode pads 10 on the upper surface of the mounting base 6 can be reduced. Therefore, the possibility of a short circuit occurring due to a foreign matter adhering on the interconnection conductors can be reduced, and the design flexibility of the routing of the interconnection conductors can be improved. Not all the electrode pads are required to be connected via the second via-hole conductors 9c. This means that some of the outermost electrode pads out of the electrode pads 10 arranged in the matrix configuration, e.g., the crystal electrode pads 10d, 10f, may be routed on the upper surface of the mounting base 6 in consideration of the strength of the mounting base 6. Thus, the size of the crystal electrode pads 10d, 10f can be increased. The crystal electrode pads 10d, 10f each having an increased size are advantageous for the measurement of the initial characteristic of the crystal oscillator element 5.

The electrode pad 10e surrounded by the other electrode pads 10 out of the electrode pads arranged in the matrix configuration is connected to the interconnection conductor 9b via the second via-hole conductor 9c. This obviates the need for routing an interconnection conductor from the electrode pad 10 located in an inner area on the upper surface of the mounting base 6, thereby preventing a short circuit between the electrode pads.

The mounting base connection electrodes 12 not connected to the external terminals 14 are provided on the upper surface of the mounting base 6, and the container connection electrodes 13 are provided in association with the mounting base connection electrodes 12 on the lower surface of the laminate substrate 2. The container connection electrodes 13 are respectively connected to the mounting base connection electrodes 13 via the electrically conductive bonding members 18. With this arrangement, the mechanical connection between the container connection electrodes 13 and the mounting base connection electrodes 12 can be achieved whether or not the container connection electrodes 13 have an electrical function. Therefore, the mechanical connection strength between the container 1 and the mounting base 6 can be improved.

Further, the oscillation output electrode pad 10a, the ground electrode pad 10h, the oscillation control electrode pad 10i and the power source voltage electrode pad 10c are respectively connected to the external terminals 14 via the interconnection conductors 9b. Thus, the arrangement of the external terminals 14 on the lower surface of the mounting base 6 can be optimized, thereby significantly contributing to the size reduction of the temperature-compensated crystal oscillator.

Thus, even if the size of the IC element 7 is reduced for the size reduction of the temperature-compensated crystal oscillator, the connection reliability of the IC element 7 can be maintained and improved, and the size reduction of the entire oscillator can be achieved in accordance with the present invention.

It should be understood that the present invention be not limited to the embodiment described above, but various changes and modifications may be made without departing from the scope of the present invention.

In the embodiment described above, the lid 4 of the container 1 is bonded to the laminate substrate 2 via the seal ring 3. Alternatively, the lid 4 may be welded directly to a bonding metallization pattern preliminarily formed on the upper surface of the laminate substrate 2.

In the embodiment described above, the seal ring 3 is attached directly to the upper surface of the laminate substrate 2 of the container 1. Alternatively, the seal ring 3 may be attached to an upper surface of a frame composed of the same ceramic material as the laminate substrate 2 and integrated with the laminate substrate 2.

In the embodiment described above, the lid 4 is welded to the main body of the container 1. Alternatively, the lid 4 may be brazed to the main body of the container 1 with the use of a brazing material such as Au—Sn.

In the embodiment described above, the pair of legs 2c, 2d are attached to the lower surface of the container 1. Alternatively, the legs 2c, 2d may each be divided into two pieces, so that four legs in total are attached to the lower surface of the container 1. Further, one of the legs 2c, 2d may be divided into two pieces, so that three legs in total are attached to the lower surface of the container 1.

Although only the IC element 7 is disposed in the space defined between the upper surface of the mounting base 6 and the lower surface of the container 1 by bonding the container 1 to the mounting base 6 in the embodiment described above, an electronic element such as a capacitor connected between the power source voltage interconnection conductor and the ground potential interconnection conductor or between the oscillation output interconnection conductor and the ground potential interconnection conductor may be provided in the aforesaid space.

Figure 10A:
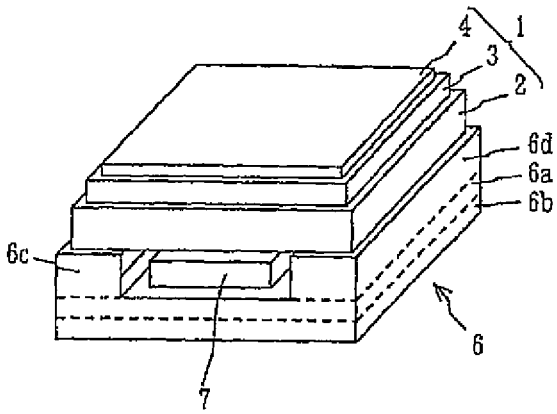
FIGS. 10(a) and 10(b) are a perspective view and a sectional view, respectively, illustrating a temperature-compensated crystal oscillator according to another embodiment of the present invention.
Figure 10B:
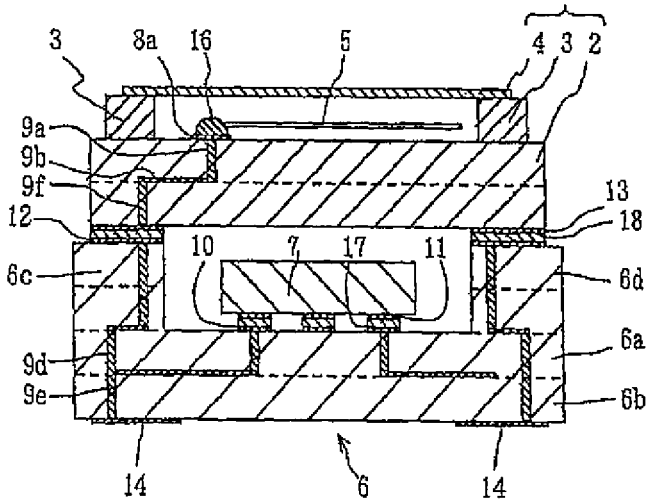

Next, an explanation will be given to another embodiment of the present invention. In this embodiment, a cavity accommodating therein an IC element 7 is formed in an upper surface of amounting base 6, and a lower surface of a container 1 is bonded to an upper surface portion of the mounting base 6 around an opening of the cavity as shown in FIGS. 10(a) and 10(b). The mounting base 6 includes laminated substrates 6a, 6b and legs 6c, 6d each having a generally rectangular section.

The temperature-compensated crystal oscillator according to this embodiment is constructed so that the IC element 7 is disposed in a space defined between the upper surface of the mounting base 6 and the lower surface of the container 1 by the legs 6c, 6d and electrode pads 10 are provided on the upper surface of the mounting base 6 as shown in FIG. 3(a).

The temperature-compensated crystal oscillator having such a construction provides the same effects as the embodiment described above with reference to FIG. 1.

Figure 11A:
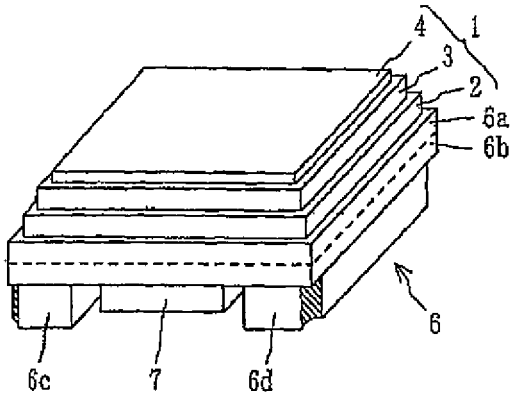
FIGS. 11(a) and 11(b) are a perspective view and a sectional view, respectively, illustrating a temperature-compensated crystal oscillator according to further another embodiment of the present invention.
Figure 11B:
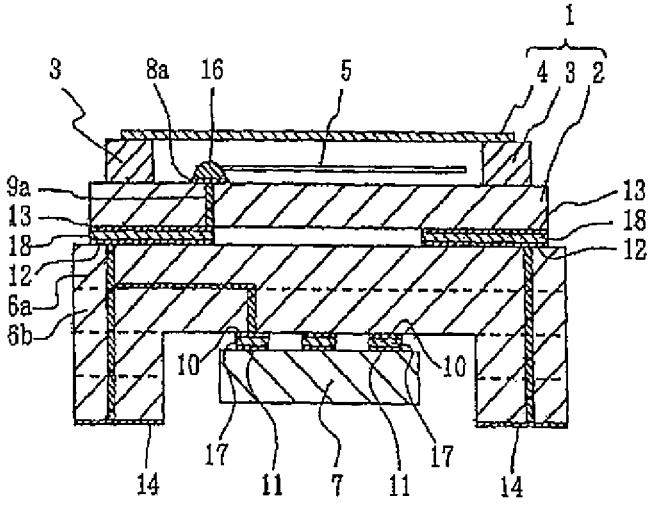

Next, an explanation will be given to further another embodiment of the present invention. In this embodiment, a mounting base 6 is bonded to a lower surface of a container 1, and a cavity accommodating therein an IC element is formed in a lower surface of the mounting base 6 as shown in FIGS. 11(a) and 11(b). The mounting base 6 includes laminated substrates 6a, 6b and legs 6c, 6d each having a generally rectangular section, and is attached to the container 1 with the substrates 6a, 6b thereof bonded to the lower surface of the container 1.

The temperature-compensated crystal oscillator having such a construction provides the same effects as the embodiment described above with reference to FIG. 1.

Next, a temperature-compensated crystal oscillator according to still another embodiment of the present invention will be described in detail with reference to FIGS. 12 and 13. No explanation will be given to components having the same construction as those of the temperature-compensated crystal oscillator of FIG. 1, but only different points will be described.

Figure 12:
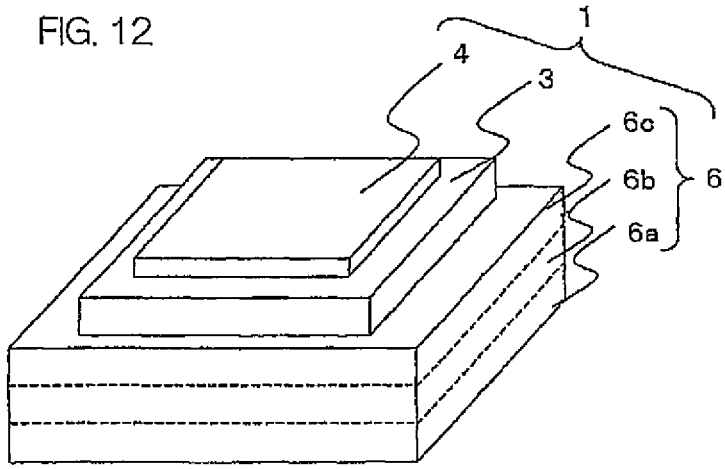
FIG. 12 is a perspective view illustrating a temperature-compensated crystal oscillator according to still another embodiment of the present invention.
Figure 13:
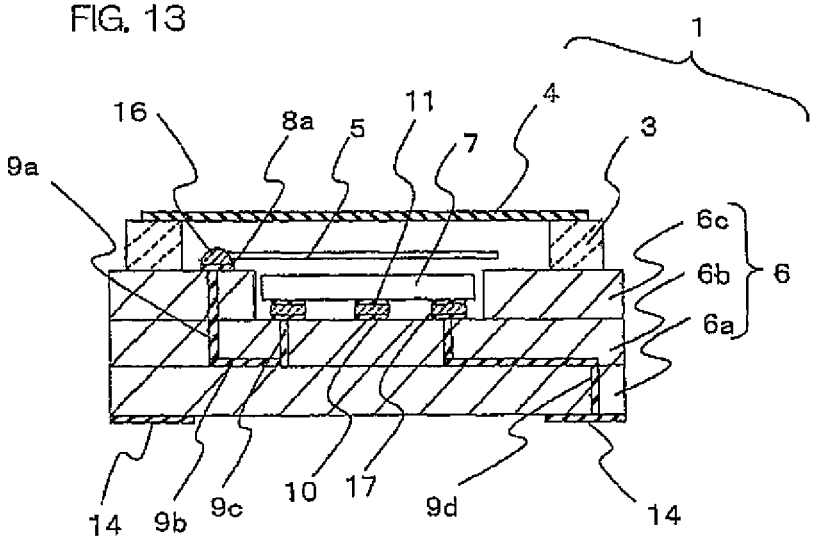
FIG. 13 is a sectional view of the temperature-compensated crystal oscillator of FIG. 12.

The temperature-compensated crystal oscillator is constructed as shown in FIGS. 12 and 13.

The temperature-compensated crystal oscillator 1 shown in these figures has a construction such that a crystal oscillator element 5 is bonded to an upper surface of a mounting base 6 having a cavity accommodating therein an IC element 7.

The temperature-compensated crystal oscillator 1 includes the mounting base 6 including planar substrates 6a, 6b and a frame base 6c stacked in this order and each composed of a ceramic material such as glass-ceramic or alumina ceramic, a seal ring 3 composed of a metal such as a 42-alloy, cobal or phosphor bronze, and a lid 4 composed of the same metal as the seal ring 3. The seal ring 3 is attached to the upper surface of the mounting base 6, and the lid 4 is placed and fixed to an upper surface of the seal ring 3. The IC element 7 is provided in the cavity of the mounting base 6, and the crystal oscillator element 5 is mounted inside the seal ring 3 on the upper surface of the mounting base 6. A pair of mounting pads 8a, 8b (a mounting pad 8b is not illustrated in FIG. 13) connected to oscillation electrodes of the crystal oscillator element 5 are provided on an upper surface of the frame base 6c.

Figure 14A:
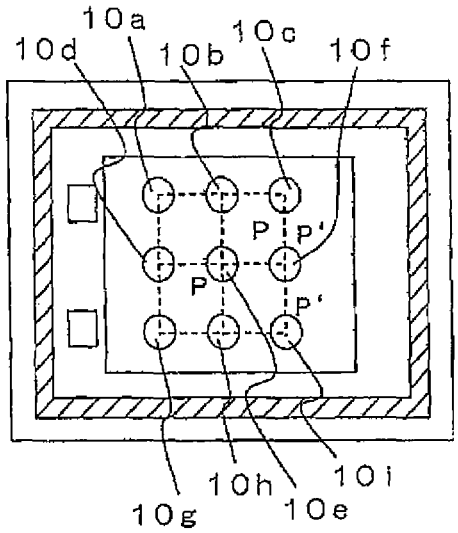
FIG. 14(a) is a plan view of a mounting base of the temperature-compensated crystal oscillator of FIG. 12 as seen from an upper side thereof.
Figure 14B:
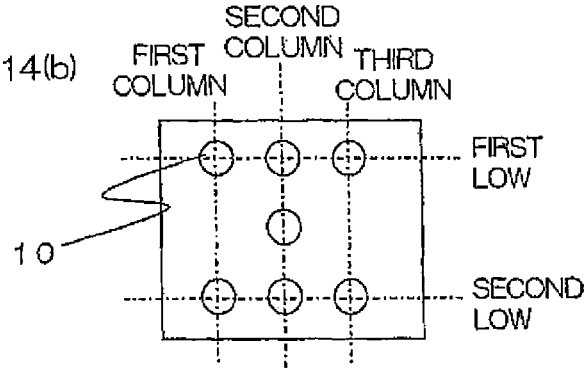
FIGS. 14(b) and 14(c) are plan views illustrating other conceivable arrangements of electrode pads provided in an IC element mounting area of the mounting base.
Figure 14C:
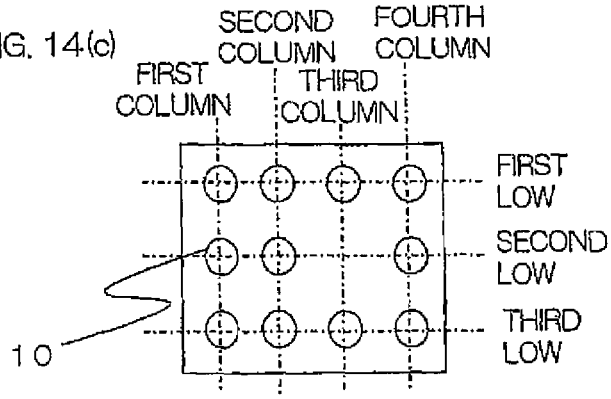
Figure 15:
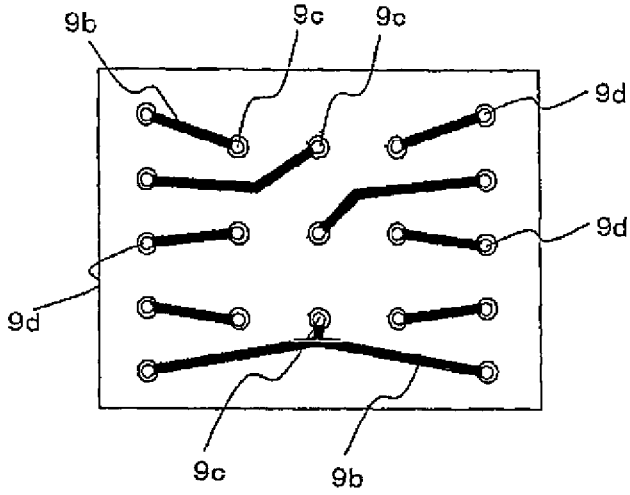
FIG. 15 is a plan view illustrating interconnection conductors and via-hole conductors provided in the mounting base of the temperature-compensated crystal oscillator of FIG. 12.
Figure 16:
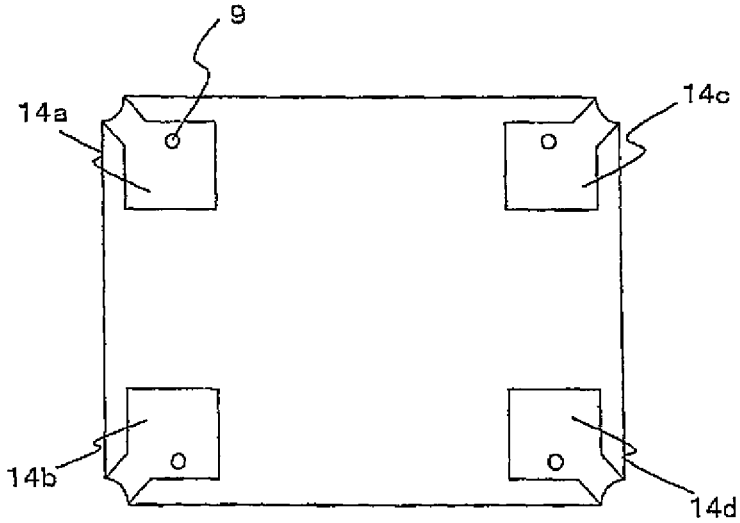
FIG. 16 is a plan view of the temperature-compensated crystal oscillator of FIG. 12 as seen from a lower side thereof.
Figure 17A:
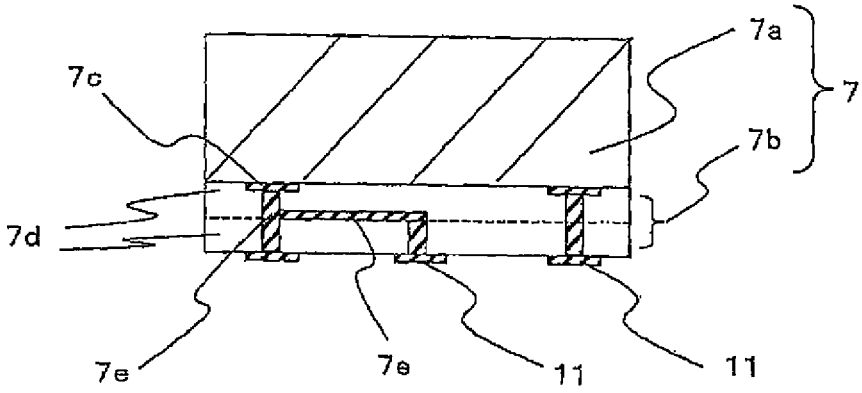
FIGS. 17(a) and 17(b) are a sectional view of an IC element of the temperature-compensated crystal oscillator of FIG. 12, and a plan view of the IC element as seen from the lower side thereof, respectively.
Figure 17B:
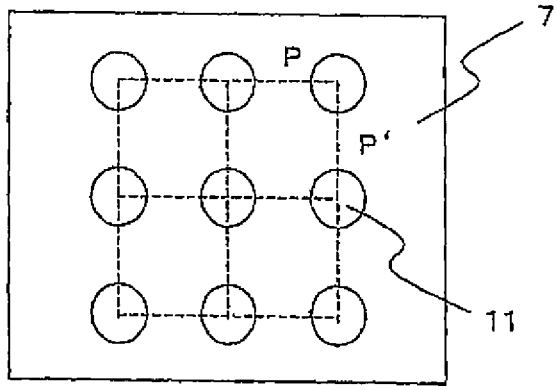
Figure 18:
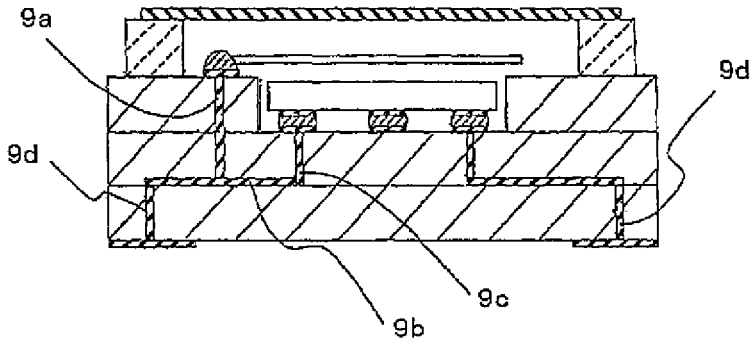
FIG. 18 is a sectional view of a temperature-compensated crystal oscillator according to another embodiment of the present invention, particularly illustrating connection of a crystal electrode pad.
Figure 19:
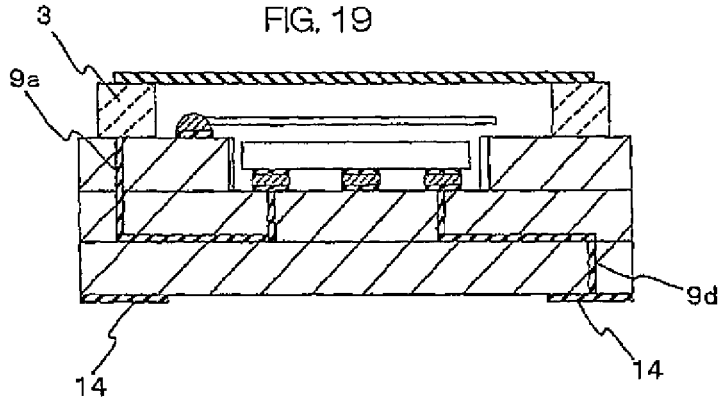
FIG. 19 is a sectional view of a temperature-compensated crystal oscillator according to another embodiment of the present invention.
Figure 20:
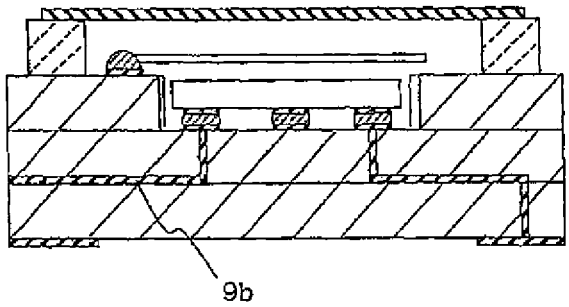
FIG. 20 is a sectional view of a temperature-compensated crystal oscillator according to another embodiment of the present invention.
Figure 21:
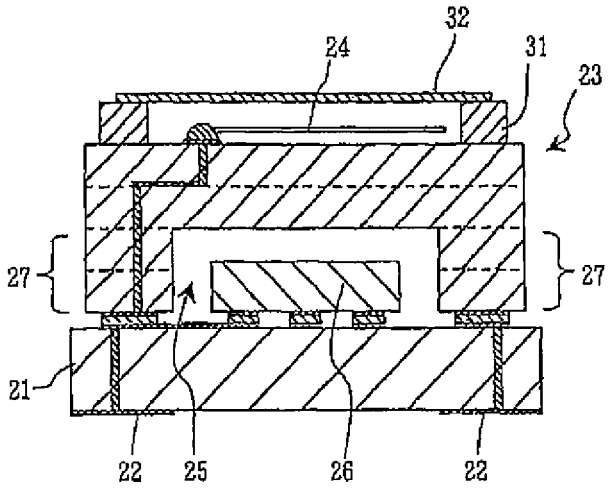
FIGS. 21(a) and 21(b) are a sectional view of a conventional temperature-compensated crystal oscillator, and a plan view of the temperature-compensated crystal oscillator as seen from a lower side thereof, respectively.
Figure 21:
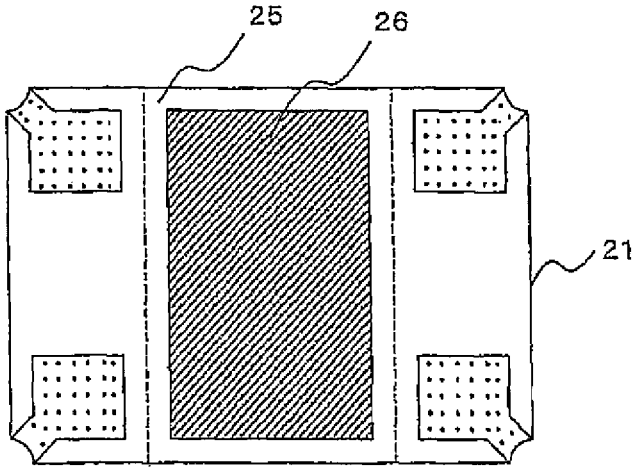
PRIOR ART FIG. 21 (b)
Figure 22:
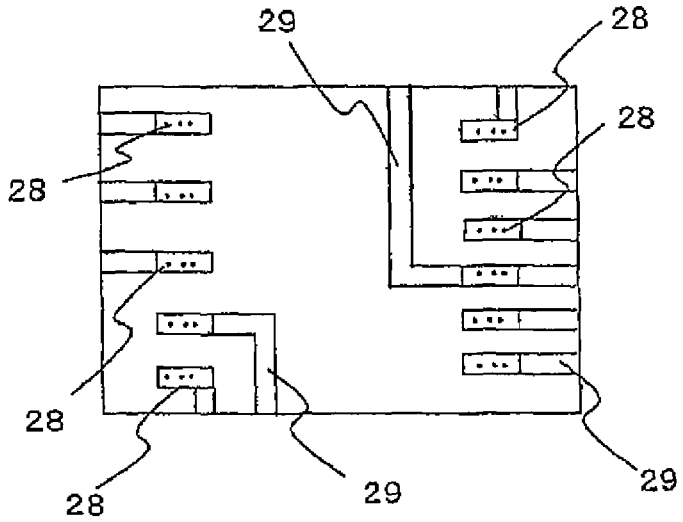
FIG. 22 is a plan view illustrating an IC element mounting area of the conventional temperature-compensated crystal oscillator.

As shown in FIGS. 14(a), 14(b) and 14(c), a pair of crystal electrode pads 10d, 10f, an oscillation output electrode pad 10a, a ground electrode pad 10h, a power source voltage electrode pad 10c, an oscillation control electrode pad 10i and at least two or more temperature compensation data writing electrode pads 10b, 10e, 10g (collectively denoted by a reference numeral 10) which are respectively connected to connection pads 11 of the IC element 7 via electrically conductive bonding members 17 such as of a solder are arranged in a matrix configuration, e.g., in a 3×3 matrix configuration, in an IC element mounting area on a center portion of the upper surface of the planar substrate 6b.

The temperature-compensated crystal oscillator having such a construction provides the same effects as the temperature-compensated crystal oscillators previously described.

What is claimed is:

1. A temperature-compensated crystal oscillator comprising:

a crystal oscillator element;

an IC element having a plurality of connection pads on a main surface thereof, for controlling an oscillation output on the basis of temperature compensation data for compensating for a temperature characteristic of the crystal oscillator element;

a mounting base having an IC element mounting area on which the IC element is mounted; and a plurality of electrode pads arranged in a matrix configuration of m rows × n columns(wherein m and n are natural numbers not smaller than 3) in the IC element mounting area of the mounting base, including an oscillation output electrode pad, a ground electrode pad, a power source voltage electrode pad, a writing electrode pad for writing the temperature compensation data, and plural crystal electrode pads connected to the crystal oscillator element, wherein the IC element mounting area has an edge portion and an interior portion, and wherein the electrode pads are electrically connected to the connection pads of the IC element, and at least one of the electrode pads is disposed in the interior portion of the IC element mounting area.

2. The temperature-compensated crystal oscillator according to claim 1, wherein the electrode pads are arranged at a predetermined pitch linearly in rows and columns, and the respective rows extend perpendicularly to the respective columns.

3. A temperature-compensated crystal oscillator comprising:

a crystal oscillator element;

an IC element having a plurality of connection pads on a main surface thereof, for controlling an oscillation output on the basis of temperature compensation data for compensating for a temperature characteristic of the crystal oscillator element;

a mounting base having an IC element mounting area on which the IC element is mounted; and a plurality of electrode pads arranged in a matrix configuration of m rows×n columns(wherein m and n are natural numbers not smaller than 2) in the IC element mounting area of the mounting base, including an oscillation output electrode pad, a ground electrode pad, a power source voltage electrode pad, a writing electrode pad for writing the temperature compensation data, and plural crystal electrode pads connected to the crystal oscillator element, wherein at least one of the electrode pads arranged in the IC element mounting area of the mounting base is a dummy electrode pad bonded to one of the connection pads of the IC element.

4. The temperature-compensated crystal oscillator according to claim 3, wherein the electrode pads are connected to the connection pads, and at least one of the connection pads has a size larger than the electrode pads.

5. A temperature-compensated crystal oscillator comprising:

a crystal oscillator element;

an IC element having a plurality of connection pads on a main surface thereof, for controlling an oscillation output on the basis of temperature compensation data for compensating for a temperature characteristic of the crystal oscillator element;

a mounting base having an IC element mounting area on which the IC element is mounted; and a plurality of electrode pads arranged in a matrix configuration of m rows×n columns(wherein m and n are natural numbers not smaller than 2) in the IC element mounting area of the mounting base, including an oscillation output electrode pad, a ground electrode pad, a power source voltage electrode pad, a writing electrode pad for writing the temperature compensation data, and plural crystal electrode pads connected to the crystal oscillator element, wherein the mounting base comprises at least two laminated insulative layers and an interconnection conductor interposed between the two insulative layers and connected to a via-hole conductor disposed just below or above the electrode pads.

6. The temperature-compensated crystal oscillator according to claim 5, wherein the natural numbers m and n are not smaller than 3, and the electrode pad connected to the interconnection conductor via the via-hole conductor is surrounded by the other electrode pads.

7. The temperature-compensated crystal oscillator according to claim 5, wherein the electrode pads are connected to the connection pads, and at least one of the connection pads has a size larger than the electrode pads.

8. A temperature-compensated crystal oscillator comprising:

a crystal oscillator element;

an IC element having a plurality of connection pads on a main surface thereof, for controlling an oscillation output on the basis of temperature compensation data for compensating for a temperature characteristic of the crystal oscillator element;

a mounting base having an IC element mounting area on which the IC element is mounted; and a plurality of electrode pads arranged in the IC element mounting area of the mounting base, wherein the electrode pads are electrically connected to the connection pads of the IC element, and the IC element comprises a semiconductor element and a re-interconnection layer provided on a main surface of the semiconductor element for associating the connection pads of the IC element with electrode pad positions.

9. The temperature-compensated crystal oscillator according to claim 8, wherein a plurality of electrode pads is arranged in a matrix configuration of m rows×n columns (wherein m and n are natural numbers not smaller than 2).

10. The temperature-compensated crystal oscillator according to claim 8, wherein the IC element further includes an internal connection electrode formed on a main surface of the semiconductor element, the re-interconnection layer has a plurality of insulation layers, and a conductive layer interposed between the insulation layers and the internal connection electrode is electrically connected with the connection pad through the conductive layer.

11. The temperature-compensated crystal oscillator according to claim 8, wherein the electrode pads are connected to the connection pads, and at least one of the connection pads has a size larger than the electrode pads.

12. A temperature-compensated crystal oscillator according to claim 1, wherein the mounting base has a planar shape, and a spacer having a thickness greater than a height of the IC element is provided on the lower surface of the container.

13. A temperature-compensated crystal oscillator according to claim 1, wherein the mounting base has a cavity formed in an upper surface thereof and accommodating therein the IC element, and an upper surface portion of the mounting base around an opening of the cavity is bonded to the lower surface of the container.

14. A temperature-compensated crystal oscillator comprising a mounting base having a cavity which opens to an upper surface of the mounting base, a crystal oscillator element provided in the cavity, and an IC element provided in the cavity for controlling a predetermined oscillation output on the basis of temperature compensation data for compensating for a temperature characteristic of the crystal oscillator element, the mounting base having a lower surface serving as a mounting surface; wherein a plurality of electrode pads including a pair of crystal electrode pads connected to the crystal oscillator element, an oscillation output electrode pad, a ground electrode pad, a power source voltage electrode pad, and a writing electrode pad for writing the temperature compensation data are arranged in a matrix configuration of m rows × n columns (wherein m and n are natural numbers not smaller than 2) in an IC element mounting area on a bottom surface of the cavity; and the IC element has a plurality of connection pads provided on a lower surface thereof and electrically connected to the corresponding electrode pads.

15. The temperature-compensated crystal oscillator according to claim 14, wherein the electrode pads are arranged at a predetermined pitch linearly in rows and columns, and the respective rows extend perpendicularly to the respective columns.

16. A temperature-compensated crystal oscillator according to claim 14, wherein at least one of the electrode pads arranged in the IC element mounting area on the bottom surface of the cavity is a dummy electrode pad bonded to a corresponding one of the connection pads of the IC element.

17. The temperature-compensated crystal oscillator according to claim 16, the electrode pads are connected to the connection pads and the size of a connection pad is larger than the size of a electrode pad connected to the connection pad.

18. A temperature-compensated crystal oscillator according to claim 14, wherein the mounting base comprises at least two laminated insulative layers and an interconnection conductor provided between the two insulative layers and connected to a via-hole conductor disposed just below or above a predetermined one of the electrode pads.

19. The temperature-compensated crystal oscillator according to claim 18, wherein the natural numbers m and n are not smaller than 3, and at least one of the connection pads has a size larger than the electrode pads.

20. A temperature-compensated crystal oscillator comprising:

a mounting base having a cavity on an upper surface thereof;

a crystal oscillator element provided in the cavity; and an IC element mounted on an IC element mounting area of a bottom surface of the cavity for controlling a predetermined oscillation output on basis of temperature compensation data for compensating for a temperature characteristic of the crystal oscillator element; and a plurality of electrode pads arranged in the IC element mounting area of the cavity, wherein the IC element has a plurality of connection pads provided on a main surface thereof and electrically connected to the electrode pads, and comprises a semiconductor element and a re-interconnection layer provided on a main surface of the semiconductor element for associating the connection pads of the IC element with electrode pad positions.

21. The temperature-compensated crystal oscillator according to claim 20, wherein a plurality of the electrode pads are arranged in a matrix configuration of m rows×n columns(wherein in and n are natural numbers not smaller than 2).

22. The temperature-compensated crystal oscillator according to claim 20, wherein the IC element further includes an internal connection electrode formed on a main surface of the semiconductor element, the re-interconnection layer has a plurality of insulation layers, and a conductive layer provided between the insulation layers and the internal connection electrode is electrically connected to the connection pad through the conductive layer.

23. The temperature-compensated crystal oscillator according to claim 20, wherein the electrode pads are connected to the connection pads and at least one of the connection pads has a size larger than the electrode pads.

24. A substrate for an oscillator comprising:

a base having an IC element mounting area on which an IC element is to be mounted for controlling an oscillation output on the basis of temperature compensation data for compensating for temperature characteristic of an oscillator element; and a plurality of electrode pads arranged in a matrix configuration of m rows×n columns(wherein m and n are natural numbers not smaller than 3) in the IC element mounting area of the base, including an oscillation output electrode pad, a ground electrode pad, a power source voltage electrode pad, a writing electrode pad for writing the temperature compensation data, and plural electrode pads connected to the oscillator element, wherein the IC element mounting area has an edge portion and an interior portion, and at least one of the electrode pads is disposed in the interior portion.

25. The substrate for an oscillator according to claim 24, wherein the electrode pads are arranged at a predetermined pitch linearly in rows and columns, and the respective rows extend perpendicularly to the respective columns.

26. A substrate for an oscillator comprising:

a base having an IC element mounting area on which IC element for controlling an oscillation output on the basis of temperature compensation data for compensating for temperature characteristic of an oscillator element; and a plurality of electrode pads arranged in a matrix configuration of m rows×n columns(wherein m and n are natural numbers not smaller than 2) in the IC element mounting area of the base, including an oscillation output electrode pad, a ground electrode pad, a power source voltage electrode pad, a writing electrode pad for writing the temperature compensation data, and plural electrode pads connected to the oscillator element;

wherein at least one of the electrode pads arranged in the IC element mounting area on the base is a dummy electrode pad bonded to a corresponding one of the connection pads of the IC element.

27. An oscillator comprising:

the substrate in claim 24;

an IC element mounted in the IC mounting area of the substrate for an oscillator.

28. An oscillator comprising:

the substrate in claim 26;

an IC element mounted in the IC mounting area of the substrate for an oscillator.

29. A temperature-compensated crystal oscillator comprising:

a crystal oscillator element;

an IC element having a plurality of connection pads on a main surface thereof, for controlling an oscillation output on the basis of temperature compensation data for compensating for a temperature characteristic of the crystal oscillator element;

a mounting base having an IC element mounting area on which the IC element is mounted; and a plurality of conductive patterns arranged in the IC element mounting area of the mounting base, and having a plurality of connecting portions at which the conductive patterns are connected to the connection pads of the IC element, wherein the IC element mounting area has an edge portion and an interior portion, the connecting portions are arranged in a matrix configuration of m rows×n columns (wherein m is natural number not smaller than 2, n is natural number not smaller than 3), and at least one of the connecting portions are disposed in the interior portion of the IC element mounting area.

30. A temperature-compensated crystal oscillator comprising:

a crystal oscillator element;

an IC element having a plurality of connection pads on a main surface thereof, for controlling an oscillation output on the basis of temperature compensation data for compensating for a temperature characteristic of the crystal oscillator element;

a mounting base having an IC element mounting area on which the IC element is mounted; and a plurality of conductive patterns arranged in the IC element mounting area of the mounting base, and having a plurality of connecting portions at which the conductive patterns are connected to the connection pads of the IC element, wherein the connecting portions are arranged in a matrix configuration of m rows×n columns(wherein m and n are natural numbers not smaller than 2), and at least one of the connecting portions of the conductive patterns in the IC element mounting area of the mounting base is a dummy electrode pad bonded to one of the connection pads of the IC element.

31. A temperature-compensated crystal oscillator comprising:

a crystal oscillator element;

an IC element having a plurality of connection pads on a main surface thereof, for controlling an oscillation output on the basis of temperature compensation data for compensating for a temperature characteristic of the crystal oscillator element;

a mounting base having an IC element mounting area on which the IC element is mounted; and a plurality of conductive patterns arranged in the IC element mounting area of the mounting base, and having a plurality of connecting portions at which the conductive patterns are connected to the connection pads of the IC element, wherein the connecting portions are arranged in a matrix configuration of m rows×n columns(wherein m and n are natural numbers not smaller than 2), wherein the mounting base comprises at least two laminated insulative layers and an interconnection conductor provided between the two insulative layers and connected to a via-hole conductor disposed just below or above the connecting portions.

*32. A temperature-compensated crystal oscillator comprising:*

*an IC element having a plurality of connection pads on a main surface thereof, for controlling an oscillation output on the basis of temperature compensation data for compensating for a temperature characteristic of the crystal oscillator element;*

*a mounting base including a first leg and a second leg, wherein the first and second legs are arranged along a full length of opposite sides of the mounting base;*

*the IC element mounted on the mounting base, wherein an IC element mounting area has an edge portion and an interior portion, and wherein a plurality of electrode pads are electrically connected to the connection pads of the IC element, and at least one of the plurality of electrode pads is disposed in the interior portion of the IC element mounting area;*

*a container bonded to the first and second legs such that the container covers the IC element to form a space between the container and the IC element; and*

*a crystal oscillator element accommodated in the container,*

*wherein an upper surface of the IC element is exposed to the space, and*

*wherein a side surface of the IC element is exposed to a side opening defined by the first and the second legs.*

*33. The temperature-compensated crystal oscillator according to claim 32, wherein the upper surface of the IC element is totally exposed to the space.*

*34. The temperature-compensated crystal oscillator according to claim 32, wherein the side surface of the IC element is totally exposed to the side opening.*

* * * * *

UNITED STATES PATENT AND TRADEMARK OFFICE

CERTIFICATE OF CORRECTION

PATENT NO. : RE44,368 E
APPLICATION NO. : 12/500454
DATED : July 16, 2013
INVENTOR(S) : Hidefumi Hatanaka et al.

It is certified that error appears in the above-identified patent and that said Letters Patent is hereby corrected as shown below:

In the Claims

In Column 19, Claim 21, Lines 40-41, please replace:
"columns (wherein in and n are natural numbers not smaller than 2)."
with: "columns (wherein m and n are natural numbers not smaller than 2)."

Signed and Sealed this
Fifteenth Day of October, 2013

Teresa Stanek Rea
*Deputy Director of the United States Patent and Trademark Office*